United States Patent [19]

Taniguchi

[11] Patent Number: 5,661,546
[45] Date of Patent: Aug. 26, 1997

[54] PROJECTION EXPOSURE APPARATUS AND METHOD WITH CHANGING IMAGING CHARACTERISTICS AND ILLUMINATION CONDITIONS

[75] Inventor: Tetsuo Taniguchi, Yokohama, Japan

[73] Assignee: Nikon Corporation, Tokyo, Japan

[21] Appl. No.: 306,899

[22] Filed: Sep. 16, 1994

[30] Foreign Application Priority Data

Sep. 21, 1993  [JP]  Japan ................................. 5-234842

[51] Int. Cl.$^6$ ................................................ H01L 21/30
[52] U.S. Cl. ........................... 355/53; 355/30; 355/55
[58] Field of Search ............................... 355/30, 52, 53, 355/55

[56] References Cited

U.S. PATENT DOCUMENTS

| | | | |
|---|---|---|---|
| 4,558,949 | 12/1985 | Uehara et al. | 356/152 |
| 4,629,313 | 12/1986 | Tanimoto | 355/53 |
| 4,650,983 | 3/1987 | Suwa | 250/204 |
| 4,666,273 | 5/1987 | Shimizu et al. | 353/101 |
| 4,770,531 | 9/1988 | Tanaka et al. | 356/358 |
| 4,900,939 | 2/1990 | Aoyama | 250/548 |
| 4,902,900 | 2/1990 | Kamiya et al. | 250/548 |
| 4,931,830 | 6/1990 | Suwa et al. | 355/71 |
| 5,117,255 | 5/1992 | Shiraishi et al. | 355/53 |
| 5,204,535 | 4/1993 | Mizutani | 250/548 |
| 5,309,198 | 5/1994 | Nakagawa | 355/67 |
| 5,335,044 | 8/1994 | Shiraishi | 355/53 |
| 5,337,097 | 8/1994 | Suzuki et al. | 353/101 |

FOREIGN PATENT DOCUMENTS

| | | | |
|---|---|---|---|
| 61-91662 | 5/1986 | Japan . | |
| 62-229838 | 10/1987 | Japan . | |
| 63-271927 | 11/1988 | Japan | 355/30 |
| 1-273318 | 11/1989 | Japan | 355/30 |
| 3-40934B | 6/1991 | Japan . | |
| 4-101148 | 4/1992 | Japan . | |
| 4-162039 | 6/1992 | Japan . | |
| 4-225514 | 8/1992 | Japan . | |
| 4-348019 | 12/1992 | Japan . | |
| 6-45217 | 2/1994 | Japan . | |

*Primary Examiner*—Joan H. Pendegrass
*Attorney, Agent, or Firm*—Shapiro and Shapiro

[57] ABSTRACT

While a mask is illuminated under a predetermined illumination condition to transfer the image of the pattern of the mask to a substrate, the amount of imaging characteristic change of a projection optical system is calculated by the use of calculation parameters corresponding to the illumination condition, and the imaging characteristics are adjusted based on the calculated amount. Further, when the pattern on the mask or the illumination condition is changed, the amount of imaging characteristic change is calculated based on an amount of energy stored in the projection optical system prior to the changing of the condition, pattern exposure is started immediately after the changing of the condition, and the imaging characteristics are adjusted based on the calculated amount.

26 Claims, 4 Drawing Sheets

FIG. 3
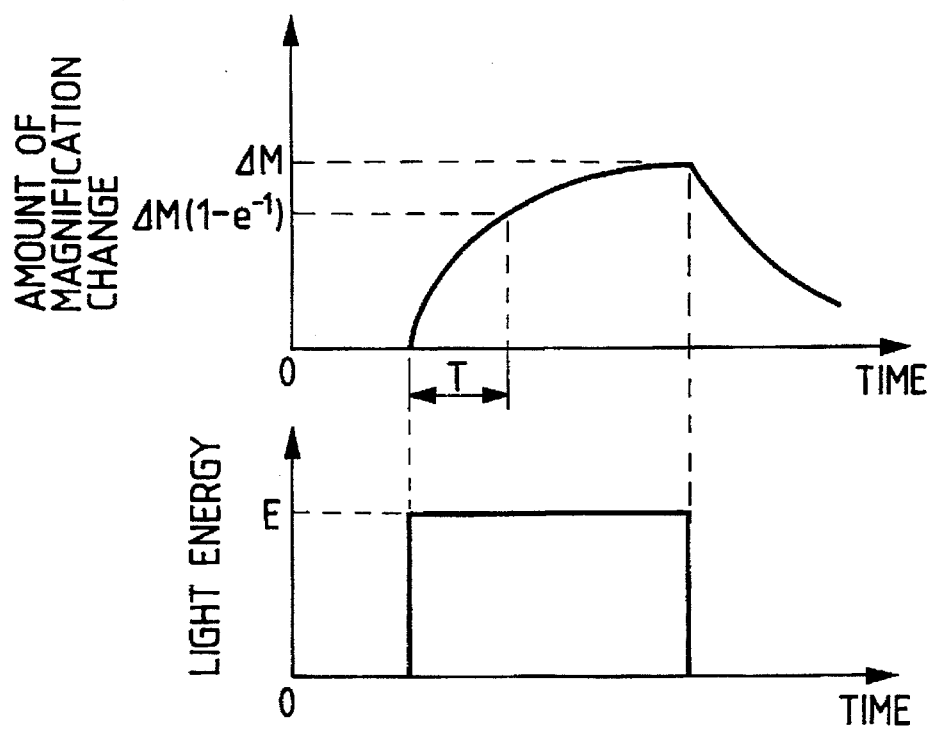
FIG. 4A
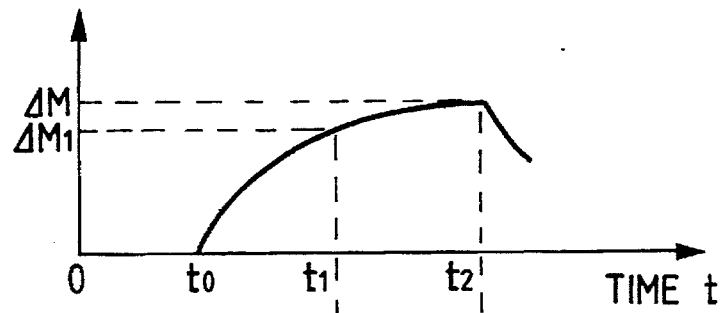
FIG. 4B
FIG. 4C
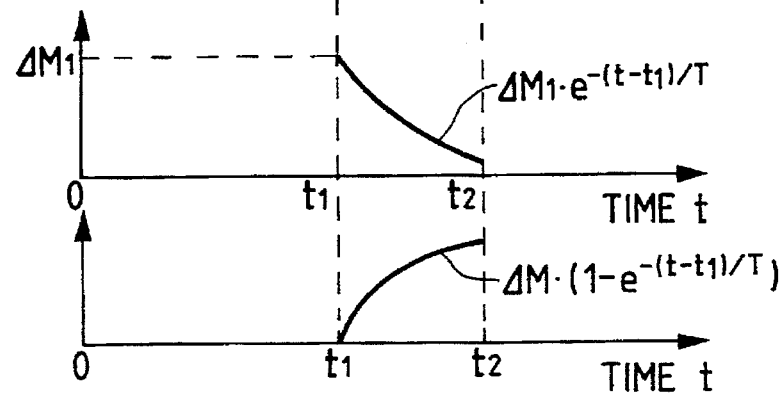

PROJECTION EXPOSURE APPARATUS AND METHOD WITH CHANGING IMAGING CHARACTERISTICS AND ILLUMINATION CONDITIONS

BACKGROUND OF THE INVENTION

1. Field of the Invention

The present invention relates to a projection exposure apparatus and method in which highly accurate imaging characteristics are required to manufacture semiconductor integrated circuits, liquid crystal devices, thin film magnetic heads, etc. and more particularly to the maintenance of imaging characteristic performance of a projection optical system.

2. Related Background Art

In a photolithography process for forming a circuit pattern of a semiconductor device, etc., a circuit pattern formed on a reticle (mask) is transferred to a substrate (a semiconductor wafer, glass plate, etc.). More specifically, photosensitive photoresist is applied to the substrate and the pattern of the reticle is transferred to the photoresist in accordance with transparent portions of the pattern of the reticle. In a projection exposure apparatus (e.g., stepper), the image of a reticle pattern is transferred to a wafer via a projection optical system.

In such an apparatus, light flux from a light source is made into approximately a round cross-sectional shape (or rectangular shape) with the optical axis of an illumination optical system as the center in a plane of the illumination optical system (hereinafter called a pupil plane of the illumination optical system) being a Fourier transform plane with respect to the pattern of the reticle, or in a plane close to the pupil plane of the illumination optical system. Therefore, the light flux is incident on the reticle approximately perpendicularly. Also, the circuit pattern of the reticle (glass plate such as quartz) is constituted of light-transmitting portions with the transmittance of about 100% with respect to the light flux and light-shielding portions with the transmittance of about 0%.

In order to transfer a more minute pattern to the wafer in the conventional exposure method, it is necessary to use a light source for emitting light with a much shorter wavelength or to use a projection optical system with a much larger numerical aperture. However, presently, it is difficult to make the light source emit light with a much shorter wavelength (200 nm or less) since there is no optical material usable as an optical transmitting member and there is not a stabilized light source capable of emitting a large quantity of light. Also, the increase of the numerical aperture of the projection optical system reaches the theoretical limitation and further increase is hopeless now. Even if the increase of the numerical aperture were achieved, the depth of focus determined by $\pm\lambda/NA^2$ is decreased in accordance with the increase of the numerical aperture, so that the depth of focus is shorted and then a practical exposure apparatus cannot be obtained.

Then, a phase shift reticle provided with a phase shifter (dielectric thin film, etc.) has been proposed in which the phase of the light transmitted through a specific light-transmitting portion among the light-transmitting portions is shifted $\pi$ (rad) with respect to the light transmitted through the other light-transmitting portions. Such a phase shift reticle is disclosed in, e.g., Japanese Patent Publication No. 62-50811. According to the phase shift reticle, the transfer of a more minute pattern is possible as compared with the ordinary reticle (the conventional reticle with the light-transmitting portions and the light-shielding portions). That is, there is an effect of improving the resolving power. When using the phase shift reticle, the numerical aperture (coherence factor $\sigma$) of the illumination optical system needs to be optimized. Although so far, various types of phase shift reticles have been proposed, typical ones are a spatial frequency modulation type (Japanese Patent Publication No. 62-50811), a half tone type (Japanese Patent Application Laid-Open No. 4-162039), a shifter light-shielding type and an edge emphasizing type.

Also, recently, an attempt has been made to optimize the illumination condition or to enable the transfer of a minute pattern by finding a suitable exposure method. For example, in U.S. Pat. No. 4,931,830, a method has been proposed to improve the resolving power and the depth of focus by selecting a combination of the numerical aperture ($\sigma$ value) of an illumination optical system and the numerical aperture of a projection optical system for each pattern line width of patterns. Further, an annular illumination method (Japanese Patent Application Laid-Open No. 61-91662) and a deformation light source method or an inclining illumination method (Japanese Patent Application Laid-Open No. 4-101148, and Japanese Patent Application No. 4-408096) have been proposed. In the annular illumination method, the light quantity distribution of light flux from a light source is defined in an annular shape in the pupil plane of an illumination optical system or in a plane close to the pupil plane. In the inclining illumination method, the light quantity distribution of light flux from a light source in the pupil plane of an illumination optical system, or in a plane close to the pupil plane is made maximum at least one position being off-centered a predetermined length from the optical axis of the illumination optical system and so the light flux is inclined a predetermined angle with respect to the reticle pattern. However, either method is not effective for all reticle patterns, i.e., all pattern line widths and shapes, and needs to select an optimum illumination method and an illumination condition for each reticle or each pattern of reticles. Therefore, it is necessary to provide a projection exposure apparatus with a structure for varying the illumination condition ($\sigma$ value) in the illumination optical system.

In projection exposure apparatuses, recently, there have been strong demands on maintaining imaging characteristics (magnification, focus position) of the projection optical system to be a predetermined value with high accuracy. Therefore, various methods for correcting imaging characteristics have been proposed and put to practical use. Among those methods, a method for correcting the change of imaging characteristics due to light absorption of the projection optical system is disclosed in, e.g., U.S. Pat. No. 4,666,273. In this method, the amount of stored energy (amount of heat) in the projection optical system due to the incidence of light (i-lines, KrF excimer laser, etc.) to the projection optical system is sequentially calculated, and the amount of imaging characteristic change due to the amount of stored energy is obtained, whereby the imaging characteristics are adjusted finely by a predetermined correcting mechanism. As the correcting mechanism, for example, there is a method in which a space between two lens elements among a plurality of lens elements constituting the projection optical system is sealed and the pressure of the sealed space is regulated.

When changing the illumination condition of the illumination optical system as above, or when exchanging the reticle, or when switching the pattern within the reticle by driving a reticle blind (illumination field stop), the distribution of the quantity of transmitted light is changeable in the pupil plane of the projection optical system or in lens elements close to the pupil plane due to the above change. As light passes an area in the vicinity of the pupil plane concentrically, when the light quantity distribution is changed in there, the change of imaging characteristics due to light absorption of the projection optical system is largely influenced by that matter. Then, as disclosed in, e.g., Japanese Patent Application Laid-Open No. 62-229838, it is conceivable that calculation parameters used for calculating the amount of imaging characteristic change of the projection optical system due to the light absorption are corrected (exchanged) for each illumination condition, and the change of imaging characteristics due to the changing of illumination condition is obtained accurately by the use of the corrected parameters (i.e., calculation parameters most suitable for the illumination condition after the changing operation), and is corrected. Also, even though the projection optical system is not affected by the light absorption, the imaging characteristics might be changed by fine aberration conditions of the projection optical system due to the differences between passing positions of light flux. Therefore, a method for imparting a predetermined offset to the correction value of the imaging characteristics in accordance with the change of the illumination condition has been considered.

When correcting the imaging characteristics by the use of the correction parameters, there is no problem from the standpoint of a long period of time. However, the phenomenon of the heat storage of the projection optical system has past hysteresis. Therefore, when changing the illumination condition corresponding to the reticle and its pattern, even though the amount of imaging characteristic change is immediately calculated and corrected in accordance with calculation parameters corrected under a new illumination condition, inconveniences occur for correcting the imaging characteristics since the hysteresis corresponding to the illumination condition set prior to its changing operation is left, and this hysteresis is not taken into consideration when only the calculation parameters are corrected.

The first inconvenience is that due to the heat distribution produced by the previous illumination condition, even though the above-mentioned offset component is taken into consideration, the calculated imaging characteristics under the new illumination condition (after the changing of the illumination condition) does not coincide with the actual imaging characteristics. Namely, as the offset component is obtained in the state that the projection optical system is not affected by light absorption, if the influence of the light absorption in the previous illumination condition is left, an offset for the influence needs to be imparted further. That is, the amount of imaging characteristic change becomes discontinuous before and after the changing of the illumination condition. Therefore, the imaging characteristics cannot be corrected continuously to the changing of the illumination condition.

The second inconvenience occurs at the time of performing exposure under the new illumination condition even though the first inconvenience is solved by any method. That is, immediately after the changing of the illumination condition, in the lens elements close to the pupil plane of the projection optical system, the heat distribution condition under the previous illumination condition and the heat distribution condition under the new illumination condition are superimposed to be a heat distribution different from both states. Therefore, even though the amount of imaging characteristic change is calculated by the calculation parameters under either illumination condition, the result of the calculation will not coincide with the actual amount of imaging characteristic change. The imaging characteristics (i.e., the heat distribution condition of the projection optical system) in such a transient state cannot be expressed by the simple sum of both. Therefore, in this transient state, it is very difficult to calculate and correct the amount of imaging characteristic change precisely. Accordingly, when a pattern exposure is carried out to a wafer under the transient state, it is impossible to obtain a circuit pattern satisfying the initial characteristics.

Then, a method for solving such a problem has been proposed in, e.g., Japanese Patent Application Laid-Open No. 6-45217. In this method, when the illumination condition corresponding to a reticle or its pattern is changed, an exposure operation with respect to a photosensitive substrate is stopped until the amount of imaging characteristic change due to light absorption of a projection optical system under the previous illumination condition becomes a predetermined permissible value or less, or the influence of the amount of energy (hysteresis) stored in the projection optical system prior to the change of the illumination condition with respect to the imaging characteristics is decreased to a negligible degree. Thereafter, the exposure operation is performed while the imaging characteristics of the projection optical system are controlled under the new illumination condition. According to this method, in the discontinuous or transient condition at the time of the changing the illumination condition, the exposure operation is not performed, so that the imaging characteristics of the projection optical system can be controlled precisely for each illumination condition. However, the exposure operation should be stopped each time the illumination condition or the reticle pattern is changed (each time the light quantity distribution in the pupil plane of the projection optical system is changed). Therefore, the throughput of the exposure apparatus is lowered considerably and this method cannot be said to be practical.

Also, in the transient condition after the changing of the illumination condition, as disclosed in, e.g., Japanese Patent Publication No. 3-40934, and Japanese Patent Application Laid-Open No. 4-348019, it is considered that the imaging characteristics of the projection optical system are consequently measured by the use of a reference mark on a wafer stage and exposure is executed while the imaging characteristics are corrected properly based on the result of the measurement. However, in order to measure the imaging characteristics precisely, the light quantity distribution in the pupil plane of light coming from the reference mark on the wafer state and passing the projection optical system should be made to coincide with the light quantity distribution in the pupil plane of light for exposure passing the projection optical system at the time of exposure. But, in this case, measuring means (mark detecting system) becomes complex and large in size. Further, the imaging characteristics need to be measured by interrupting the exposure operation in this method too, so that the lowering of the throughput of the exposure apparatus cannot be avoided.

SUMMARY OF THE INVENTION

It is an object of the present invention is to provide a projection exposure apparatus and method capable of performing pattern exposure with respect to a photosensitive substrate under constantly precise imaging characteristics without lowering productivity even though a pattern (the presence or absence of a phase shifter, periodicity, degree of minuteness., etc.) and an illumination condition (the numerical aperture ($\sigma$ value) of an illumination optical system, the numerical aperture of a projection optical system, annular illumination, inclining illumination, etc.) are changed.

The present invention is applied to a projection exposure apparatus provided with an illumination optical system for illuminating a mask with light from a light source, a projection optical system for projecting the image of the pattern of the mask on a photosensitive substrate, and a first adjusting device for changing imaging characteristics of the projection optical system. In one embodiment, the present invention comprises a first adjusting device for changing imaging characteristics of the projection optical system; a second adjusting device for changing an illumination condition with respect to the pattern of the mask by changing an intensity distribution of the light in a Fourier transform plane in the illumination optical system with respect to the pattern of the mask; a calculator for calculating a correction value of the imaging characteristics of the projection optical system by the use of predetermined calculation parameters while the mask is illuminated under the illumination condition set by the second adjusting device and the image of the pattern is exposed to a substrate; a controller for controlling the first adjusting device based on the correction value such that the imaging characteristics of the projection optical system is maintained so as to be a predetermined value; and a correcting device for correcting, when changing at least one of the pattern of said mask and the illumination condition and exposing a substrate, imaging characteristics set by the controller based on an amount of energy stored in the projection optical system due to the exposure performed prior to the condition changing operation.

When the light quantity distribution in the pupil plane of the projection optical system is changed in accordance with the changing of the reticle pattern and the illumination condition, immediately after the changing operation, (1) the change of imaging characteristics becomes discontinuous due to the amount of energy (amount of heat) stored in the projection optical system prior to the changing operation, and (2) the imaging characteristics cannot be obtained as the simple sum (linear sum) of the amount of energy stored under the previous condition and the amount of energy stored under the present condition. Then, the present invention notes that the correction error due to the problem (2) (i.e., the calculation as the simple sum) is small as compared with the correction error due to the problem (1) (i.e., the hysteresis (heat storage)), and even though the imaging characteristics are calculated as the simple sum, its error is small. Accordingly, in order to prevent the correction error due to the problem (1) from occurring, the imaging characteristics set by the controller by controlling the first adjusting device are corrected based on the amount of energy stored in the projection optical system prior to the changing operation. The correction error due to the problem (2) cannot be limited to zero, but the error is small and on the other hand, the correction error due to the problem (1) will not occur, so that even though exposure is carried out immediately after the changing operation, the pattern exposure to the photosensitive substrate can be performed under preferable imaging characteristics. Also, as there is no need to stop or interrupt the exposure operation after the condition changing operation, the throughput of the exposure apparatus will not be lowered.

BRIEF DESCRIPTION OF THE DRAWINGS

FIG. 3 is a graph for explaining the changing characteristic of the imaging characteristics of the projection optical system due to the light absorption;

FIGS. 4A to 4C are graphs for explaining a method of calculating the amount of imaging characteristic change due to the light absorption;

DESCRIPTION OF THE PREFERRED EMBODIMENTS

Figure 1:
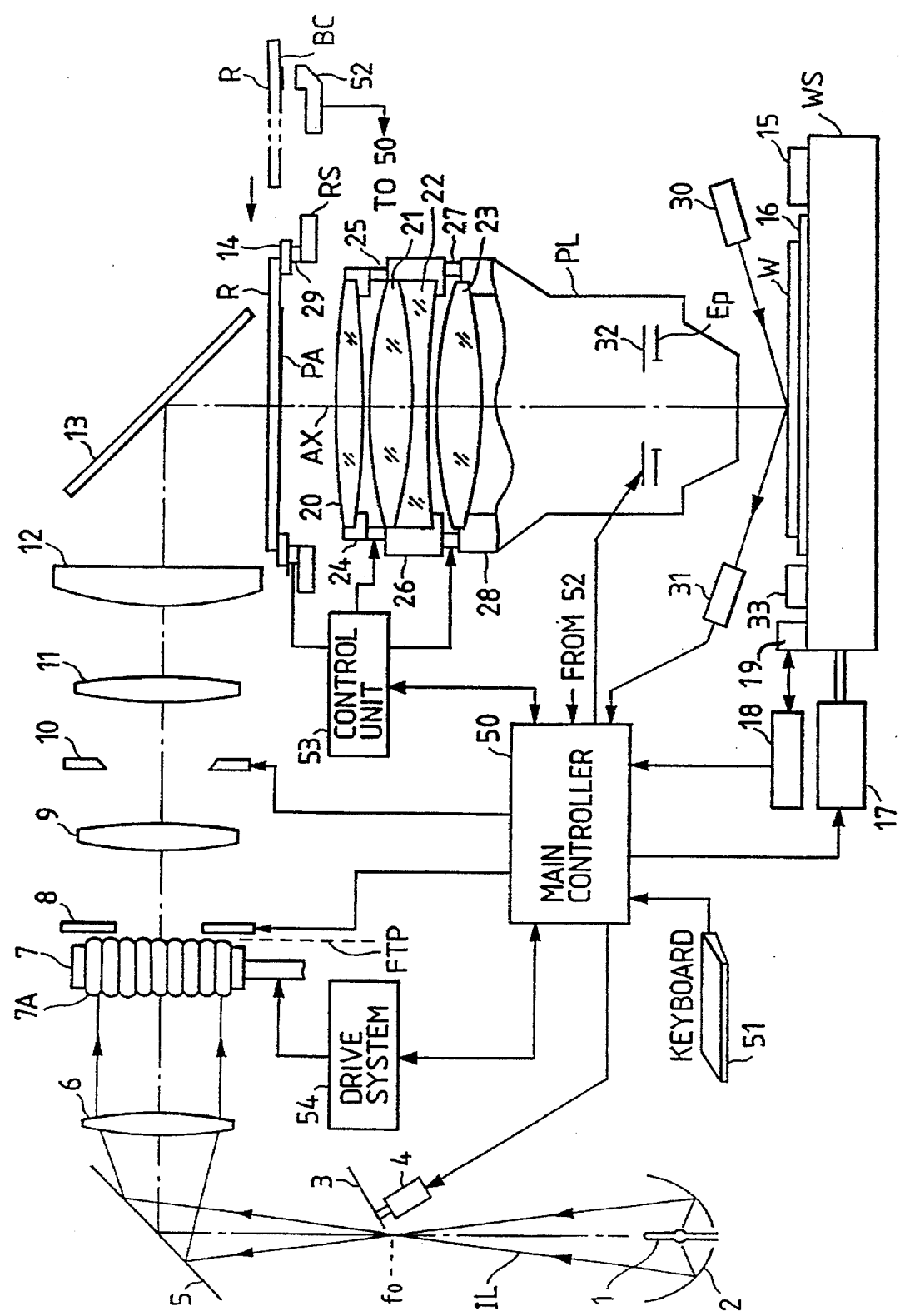
FIG. 1 is a schematic diagram showing the structure of a projection exposure apparatus according to an embodiment of the present invention.

FIG. 1 schematically shows the structure of a projection exposure apparatus according to an embodiment of the present invention. In FIG. 1, an extra-high pressure mercury lamp 1 emits light (i-lines, etc.) IL of a wavelength region for exposing resist layers. The light source may be a laser light source such as a KrF or ArF excimer laser or a higher harmonic such as a YAG laser other than the bright-lines of the mercury lamp. The light IL reflected by an elliptical mirror 2 is condensed at the second focal point $f_0$ thereof, and then enters an optical integrator (fly eye lens groups) 7A via a condensing optical system 6 including a cold mirror 5, a collimator lens, etc. In the vicinity of the exit surface of the fly eye lens groups 7A is provided a variable aperture stop (σ stop) 8 for varying the numerical aperture $NA_{IL}$ of the illumination optical system. The fly eye lens groups 7A are disposed perpendicularly to an optical axis AX such that its exit surface (precisely the surface in which secondary light source images are formed) coincides with a Fourier transform plane (a pupil plane of the illumination optical system) FTP with respect to a reticle pattern. Also, in the vicinity of the second focal point $f_0$ is disposed a shutter (e.g., a rotary shutter with four blades) 3 for closing or opening the light path of the light IL by means of a motor 4.

Figure 2:
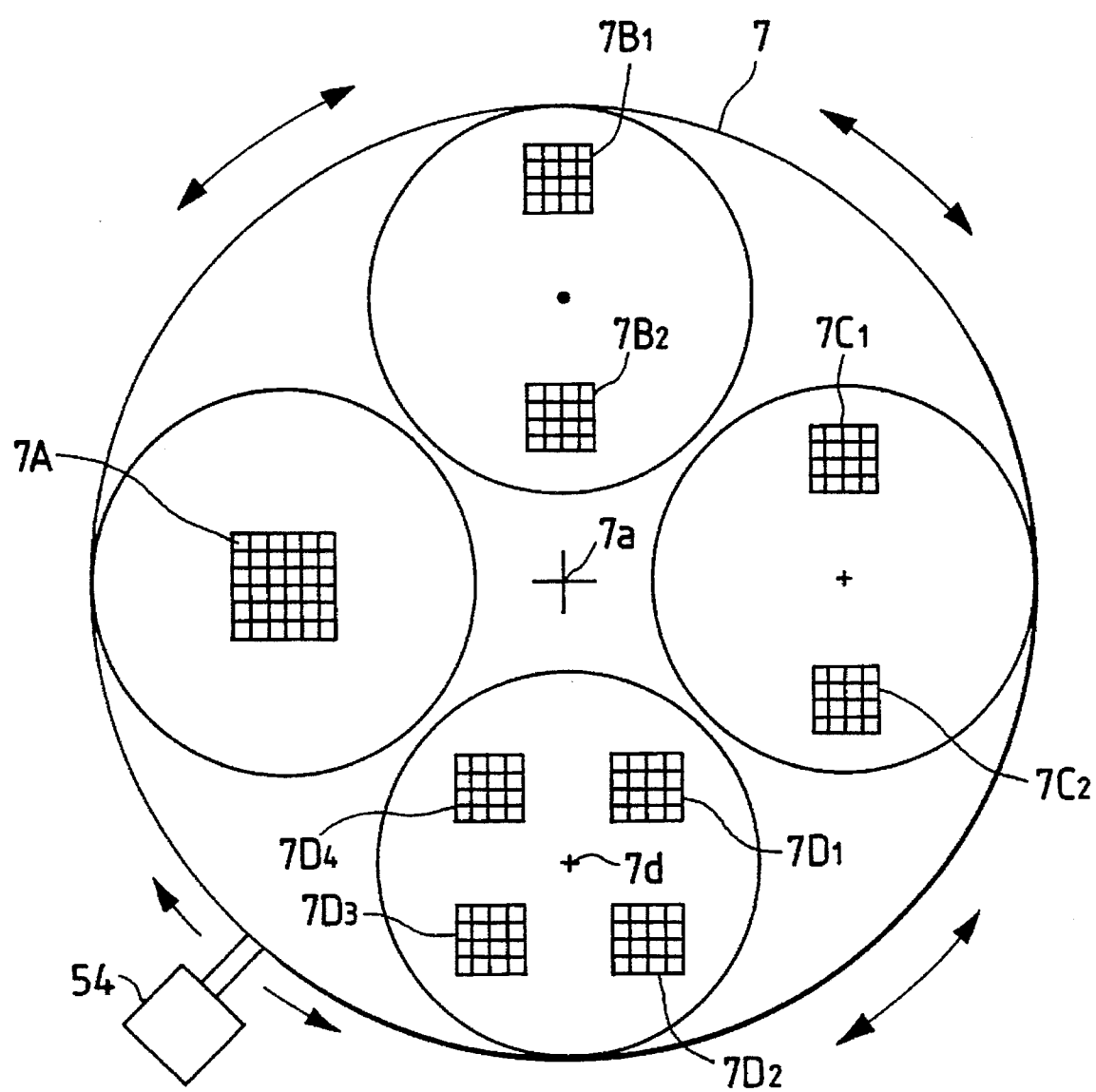
FIG. 2 is a diagram showing the structure of the holding member for holding the fly eye lens groups in FIG. 1.

In this embodiment, as shown in FIG. 2, four sets of fly eye lens groups 7A, (7B$_1$, 7B$_2$), (7C$_1$, 7C$_2$), (7D$_1$ to 7D$_4$) are provided at 90° intervals on a holding member (a turret plate) 7 rotatable around an axis 7a. The fly eye lens group 7A is utilized when adopting the ordinary illumination method and the other three sets of fly eye lens groups are utilized when adopting the deformation light source method (inclining illumination method) as disclosed in e.g., U.S. Ser. No. 122,318 (Sep. 17, 1993), and U.S. Pat. No. 5,309, 198. A drive system 54 rotates the turret plate 7 in accordance with instructions of a main controller 50 to position a desired fly eye lens group in the light path. Therefore, it is possible to vary the illumination condition in accordance with types of reticle patterns (e.g., the presence or absence of a phase shifter, the presence or absence of periodic patterns, independent patterns, etc.) and forming conditions of reticle patterns (line width, pitch, duty) by means of the variable aperture stop 8, or the turret plate 7 and the drive system 54.

Usually, the illumination condition is changed when the type or forming condition of the reticle pattern to be transferred to a wafer W is changed in accordance with the replacement of the reticle or the driving of a variable blind 10. For example, when utilizing an ordinary reticle, a phase shift reticle and a reticle having both a pattern with light-shielding portions and light-transmitting portions and a phase shift pattern (hereinafter referred to as a mixed reticle) by turns, when even though the reticle is replaced with the same type of reticle, the forming condition is different (in the case of the phase shift reticle, a spatial frequency modulation type or the like), or when utilizing, by varying the illumination field by means of the variable blind 10, different circuit patterns in the same reticle whose types and forming conditions are different, the illumination condition is changed.

The variable aperture stop 8 and the turret plate 7 correspond to a second adjusting device of the present invention. As disclosed in U.S. Pat. No. 5,335,044, the second adjusting device may be a mechanism for driving a holding member provided with a plurality of aperture stops including an annular stop and a deformation light source stop to position a desired aperture stop in the pupil plane of the illumination optical system or in the vicinity thereof, or an optical system (e.g., a zoom lens system) for varying the cross-sectional shape and size (diameter) of the light flux to be incident on the selected fly eye lens group. Namely, any structure may be adopted if the intensity distribution of the light in the pupil plane (Fourier transform surface) of the illumination optical system is varied.

The light IL emitted from the fly eye lens 7A is passed through a relay lens 9, the variable blind (field stop) 10, a relay lens 11 and a condenser lens 12 and reflected by a mirror 13 to illuminate a pattern area PA of a reticle R with approximately uniform illuminance. As the variable blind 10 is disposed in a plane conjugate to the pattern surface of the reticle R, it is possible to set the illumination field of the reticle R at will by separately driving a plurality of movable blades constituting the variable blind 10 by a motor (not shown) to change the size and shape of an opening defined by the plurality of blades.

The reticle R is supported by a reticle holder 14. The reticle holder 14 is disposed via a plurality of flexible drive elements 29 (only two drive elements are shown in FIG. 1) on a reticle stage RS movable two-dimensionally in a horizontal plane. Therefore, it is possible to shift the reticle R in parallel to the direction of the optical axis AX of the projection optical system PL and to incline it in any direction with respect to a plane perpendicular to the optical axis AX by controlling the amount of expansion and contraction of the drive elements 29 by a drive element control unit 53. According to above structure, it is possible to correct imaging characteristics of the projection optical system PL, in particular, the pincushion or barrel-shape distortion, which will be described later in detail. The reticle R is positioned such that the center of the pattern area PA coincides with the optical axis AX.

The light IL passed through the pattern area PA of the reticle R enters a both-side telecentric projection optical system PL. The projection optical system PL projects the circuit pattern of the reticle R on a shot area on the surface of the wafer W which is coated with photoresist and coincides with the optimum image surface. In this embodiment, it is possible to separately drive a few lens elements (20 and 21, 22) constituting the projection optical system PL so as to correct the imaging characteristics of the projection optical system PL such as the magnification, distortion, field curvature and astigmatism (to be described later in detail). A variable aperture stop 32 is provided in a pupil plane Ep of the projection optical system PL or in a plane close thereto so as to vary a numerical aperture NA of the projection optical system PL. An example of the structure of the variable aperture stops 8, 32 is disclosed in U.S. Pat. No. 4,931,830.

The wafer W is attached to a wafer holder (θ table) 16 by means of vacuum adsorption and supported by a wafer stage WS via the wafer holder 16. The wafer stage WS is inclinable in any direction with respect to the optimum image surface of the projection optical system PL by a motor 17, is slightly movable in the optical axis direction (Z direction), and is movable two-dimensionally by means of the step-and-repeat operation. When the circuit pattern of the reticle R has been exposed on a shot area on the wafer W, the wafer W is moved to set the following shot area to the exposure position. The structure of the wafer stage WS is disclosed in, e.g., U.S. Pat. No. 4,770,531. A movable mirror 19 is secured to an end portion of the wafer stage WS to reflect a laser beam from an interferometer 18, whereby the two-dimensional position of the wafer stage WS is constantly detected by the interferometer 18 with the resolving power of, e.g., about 0.01 μm.

Also, on the wafer stage WS are provided a reference member 15 and a light quantity monitor (photoelectric sensor) 33 such that their upper surfaces and the upper surface of the wafer W are positioned at the same height. A grating pattern is formed on the surface of the reference member 15 so as to detect the focal point position in any position within the image field of the projection optical system PL. The photoelectric sensor 33 is constituted of a light detector with a light receiving surface whose area is approximately the same as, e.g., that of the image field of the projection optical system PL or that of the projection area of the reticle pattern. The sensor 33 outputs light information regarding this light quantity to the main controller 50. The light information becomes basic data for obtaining the amount of imaging characteristic change in the projection optical system PL.

Further, the apparatus has a focal point detecting system provided with a light emitting optical system 30 for emitting light flux to the optimum imaging surface of the projection optical system PL diagonally with respect to the optical axis AX so as to form the image of a pinhole or a slit, and a light receiving system 31 for receiving the light flux from the light emitting optical system 30 reflected by the surface of the wafer W. The focal point detecting system detects, as disclosed in, e.g., U.S. Pat. No. 4,650,983, the position of the surface of the wafer in the vertical direction (Z direction) with respect to the pinhole or slit image formed surface so as to detect the focusing condition of the wafer W and the projection optical system PL. It is to be noted that in order to detect the image formed surface based on a zero point, the angle of a plain parallel glass (not shown) provided in the light receiving optical system 31 is adjusted and the focal point detecting system is calibrated. Also, by utilizing a horizontal position detecting system as disclosed in, e.g., U.S. Pat. Nos. 4,558,949 and 4,902,900 or forming the focal point detecting system so as to be able to detect focal point positions at a plurality of positions within the image field of the projection optical system PL (e.g., by forming a plurality of slit images to the image field), the gradients of predetermined areas on the wafer W can be detected with respect to the image formed surfaces.

Further, the exposure apparatus has the main controller 50 for controlling the apparatus wholly; a bar code reader 52 for reading a bar code BC formed on a side of the reticle pattern for representing the title of the reticle R while the reticle R is being moved leftward until it is directly over the projection optical system PL; a keyboard 51 for an operator to input commands and data; and the drive system 54 (motor, gear train, etc.) for driving the turret plate 7 with the plurality of fly eye lens groups including the fly eye lens group 7A fixed thereto. The titles of a plurality of reticles to be handled in the projection exposure apparatus (e.g., stepper) and operation parameters of the stepper corresponding to the respective titles are registered in the main controller 50 in advance. As soon as the bar code reader 52 has read the reticle bar code BC, the main controller 50 selects a fly eye lens group on the turret plate 7 most suitable for the illumination condition (the type of reticle pattern, forming condition thereof, and the like) registered in advance as one of the operation parameters corresponding to the title of the reticle R, and outputs predetermined drive instructions to the drive system 54. Also, as the other operation parameters corresponding to the title, the optimum setting condition of the variable aperture stops 8, 32 and the variable blind 10 under the selected fly eye lens group and calculation parameters (to be described later in detail) to be used for correcting the imaging characteristics of the projection optical system PL by a correcting mechanism to be described later are registered. The setting of these conditions and the setting of the fly eye lens group are carried out at the same time. Thereby, the optimum illumination condition is set for the reticle R placed on the reticle stage RS. The above operation can be carried out by the operator by directly inputting commands and data from the keyboard 51 into the main controller 50.

Further, while the reticle pattern is exposed on the wafer W under the illumination condition set by the variable aperture stop 8 or the turret plate 7, the main controller 50 calculates a correction value of the imaging characteristics of the projection optical system by the use of the calculation parameters corresponding to the illumination condition (precisely the light quantity distribution in the pupil plane of the projection optical system PL in consideration of the type of reticle pattern, the forming condition of the reticle pattern). The control unit 53 inputs the correction value calculated by the main controller 50 to separately drive the drive elements 25, 27, 29 such that the imaging characteristics of the projection optical system PL are maintained to be a predetermined value. Also, when at least one of the reticle pattern and the illumination condition is changed to cause the light quantity distribution in the pupil plane of the projection optical system PL to be changed, the main controller 50 corrects the imaging characteristics set by the control unit 53 based on the amount of energy (heat) stored in the projection optical system PL under the previous illumination condition. More specifically, the main controller 50 calculates amounts of the imaging characteristic changes in accordance with the amount of heat stored prior to the condition changing operation change and compensates the correction value calculated in accordance with the previous calculation parameters based on the calculated amount of imaging characteristic change. Thereby, the control unit 53 drives the drive elements 25, 27, 29 in accordance with the compensated correction values, so that the imaging characteristics of the projection optical system PL can be maintained preferably with high accuracy, even though the heat stored prior to the condition changing operation is left in the projection optical system PL. Also, the main controller 50 calculates the amount of the imaging characteristic change for each increase of a predetermined period of time immediately after the condition changing operation and stops to compensate the correction values at the time when the amount of energy stored prior to the condition changing operation or the amount of the imaging characteristic change becomes a predetermined value or less.

Next, the correcting mechanism (first adjusting device) for correcting the imaging characteristics of the projection optical system will be described. In this embodiment, as disclosed in U.S. Pat. No. 5,117,255, it is possible to correct the imaging characteristics of the projection optical system PL by separately driving the reticle R, lens elements 20, (21, 22) by the drive element control unit 53. As the imaging characteristics of the projection optical system PL, there are the focal point position, magnification, distortion, field curvature, spherical aberration, astigmatism and the like. Although these values can be corrected separately, the description will be directed particularly to the corrections of the focal point position, magnification, distortion and field curvature in the both-side telecentric projection optical system for the simplicity of the description. Also, in this embodiment, the barrel-shaped or pincushion distortion is corrected by moving the reticle R.

The lens element 20 of a first group closest to the reticle R is fixed to a supporting member 24, while the lens elements (21, 22) of a second group are fixed to a supporting member 26. The lens element 23 and lens elements provided below the lens elements 23 are fixed to a lens barrel 28. It is to be noted that the optical axis AX of the projection optical system PL means the optical axis of the lens elements fixed to the lens barrel 28.

The supporting member 24 is connected to the supporting member 26 by the plurality of flexible drive elements 25 (e.g., three, but only two are shown in FIG. 1). The supporting member 26 is connected to the lens barrel 28 by the plurality of flexible drive elements 27. For example, electrostrictive elements or magnetostrictive elements are utilized for the drive elements 25, 27, 29. The amount of elastic change of the drive element in accordance with the voltage or the magnetic field imparted to the drive element is obtained beforehand. As not shown in FIG. 1, in consideration of the hysteresis of the drive element, a position detector such as a capacitive type displacement sensor, a differential transformer, etc. is provided to the drive element so as to monitor the position of the drive element in accordance with the voltage or the magnetic field, making it possible to drive the drive element with high precision.

When the lens elements 20, (21, 22) are shifted parallely in the direction of the optical axis, the magnification M, the field curvature C and the focal point position F are changed at the rate corresponding to the shift amount. If the drive amount of the lens element 20 is $x_1$, and the drive amount of the lens elements (21, 22) is $x_2$, the amounts $\Delta M$, $\Delta C$, $\Delta F$ of changes in magnification M, field curvature C, and focal point position F is expressed as:

$$\Delta M = C_{M1} \times x_1 + C_{M2} \times x_2 \tag{1}$$

$$\Delta C = C_{C1} \times x_1 + C_{C2} \times x_2 \tag{2}$$

$$\Delta F = C_{F1} \times x_1 + C_{F2} \times x_2. \tag{3}$$

$C_{M1}$, $C_{M2}$, $C_{C1}$, $C_{C2}$, $C_{F1}$, $C_{F2}$ are constants representing amounts of changes with respect to the drive amounts of the lens elements.

As mentioned above, with the optimum focal point position of the projection optical system as the zero point, the focal point detecting system 30, 31 detects the deviation of the wafer surface with respect to the optimum focal point position. Therefore, if the offset amount $x_3$ is imparted to the focal point detecting system 30, 31 electrically or optically, it is possible to correct the deviation of the focal point position caused by the driving of the lens elements 20, (21, 22) by positioning the wafer surface by the use of the focal point detecting system 30, 31. At this time, the equation (3) is expressed as:

$$\Delta F = C_{F1} \times x_1 + C_{F2} + x_2 + x_3. \qquad (4)$$

Similarly, when the reticle R is shifted parallely in the direction of the optical axis, the distortion D and the focal point position F are changed at the rate corresponding to the shift amount. If the drive amount of the reticle R is $x_4$, the amounts of changes of the distortion D and the focal point position F are expressed as:

$$\Delta D = C_{D4} \times x_4 \qquad (5)$$

$$\Delta F = C_{F1} \times x_1 + C_{F2} + x_2 + x_3 + C_{F4} + x_4. \qquad (6)$$

$C_{D4}$ and $C_{F4}$ are constants for representing the rates of changes in the respective amounts of changes with respect to the drive amount of the reticle R.

From the above, it is possible to correct the amounts $\Delta M$, $\Delta C$, $\Delta D$, $\Delta F$ at will by setting the drive amounts $x_1$ to $x_4$. Although the above description is directed to the corrections of the four imaging characteristics, the above corrections are not required if the amount of imaging characteristic change due to the light absorption among the imaging characteristic changes in the projection optical system is negligible. On the other hand, if imaging characteristics other than the above four imaging characteristics change largely, the corrections thereof are required.

Also, in this embodiment, the corrections are performed by moving the reticle R and the lens elements as the imaging characteristic correcting mechanism, but the correcting mechanism may have another structure. For example, it is possible to adopt a method in which a space formed between two lens elements is sealed and the pressure of the sealed space is regulated, as disclosed in U.S. Pat. No. 4,666,273.

In this embodiment, although the reticle R and the lens elements 20, (21, 22) are shifted by the drive element control unit 53, the lens elements 20, (21, 22), have a large influence on the imaging characteristics such as the magnification, distortion, field curvature, astigmatism and the like as compared to the other lens elements, and then are easy to control. Also, in this embodiment, a two group structure is adopted for the shiftable lens elements, but a three group structure may be adopted. In this case, it is possible to enlarge the shift range of the lens elements while restraining changes of various aberrations, and to deal with various distortions (trapezoidal distortion, rhombus-shaped distortion, etc.), field curvature and astigmatism. Also, by adopting the above-structured correcting mechanism, it is possible to deal with the change of imaging characteristics of the projection optical system PL due to the light absorption sufficiently.

According to the above structure, the drive element control unit 53 can separately shift the lens elements 20, (21, 22) and the reticle R via three points or four points of each of those peripheries in the optical axis direction for respective amounts corresponding to drive instructions from the main controller 50. As a result, the lens elements 20, (21, 22) and the reticle R can be shifted parallely in the optical axis direction and inclined in any direction with respect to a plane perpendicular to the optical axis AX.

Next, the operation of the projection exposure apparatus of this embodiment will be described. First, the method of calculating the amount of imaging characteristic change in the projection optical system PL will be described. In this embodiment, although the four imaging characteristics, i.e., the magnification, field curvature, distortion and focal point position are selectively discussed as determined above, the generation mechanisms of these imaging characteristics are different from each other, so the changes of these imaging characteristics might have different tendencies. Therefore, it is necessary to calculate these imaging characteristics separately. However, as the methods of calculating the respective imaging characteristics are the same, the calculating method will be described by taking the magnification as example. That is, the following description is directed to the method of calculating the magnification, but the method can be utilized for the other aberrations.

In general, the temperature of an object when heat is absorbed by the object is obtained by a balance between heat quantity absorbed by the object and heat quantity released from the object. This is called the first order lag generally and it is deemed that the characteristic of the magnification change shows the same trend. FIG. 3 is a characteristic curve of the first order lag and shows the changing characteristic of the magnification change when a constant amount of light is emitted to the projection optical system PL for a predetermined period of time. The changing characteristic of the magnification change shown in FIG. 3 is determined by the ratio $\Delta M/E$ of the amount $\Delta M$ of final magnification change $\Delta M$ to the light energy E and the time constant T for representing the magnification change for a certain period of time. In FIG. 3, the time constant T is expressed by the time with which the amount of magnification change reaches $\Delta M \times (1-e^{-1})$. Namely, the smaller the time constant T becomes, the faster the magnification changes. In order to obtain the ratio of $\Delta M/E$ and the time constant T, the characteristic curve in FIG. 3 should be obtained by measuring the magnification while emitting light to the projection optical system PL. That is, by attaining the characteristic data in FIG. 3, the ratio and time constant calculated from the data. Actually, as the structure of the projection optical system PL is complicated, the characteristic of the magnification change is never expressed by the simple characteristic curve shown in FIG. 3 and is expressed by the sum of several first order lags. However, for simplicity, the characteristic of the magnification change will be described by the use of the simple characteristic curve in FIG. 3.

Now, in FIG. 1, when replacing the reticle R, the wafer stage WS is driven to move the photoelectric sensor 33 to the position of the optical axis of the projection optical system PL to measure the quantity of light entering the projection optical system PL. Next, the main controller 50 calculates the amount of magnification change sequentially based on the ratio $\Delta M/E$, the time constant T, the light energy detected by the photoelectric sensor 33 and the opening or closing time of the shutter 3. The ratio $\Delta M/E$ and the time constant T are obtained beforehand.

Next, the calculation principle of the imaging characteristics according to this embodiment will be described in detail. On the assumption that constant light energy E as shown in FIG. 3 is emitted to the projection optical system PL (which will not happen in the actual exposure operation), the calculation principle will be described with reference to FIGS. 4A to 4C. First, the time $t_1$ during the energy radiation is considered.

In FIG. 4A, if the amount of magnification change at the time $t_1$ is $\Delta M_1$, the amount of magnification change generated by the energy radiation from the time $t_0$ to the time $t_1$ is damped, as shown in FIG. 4B. FIG. 4B shows the damping state of the amount of magnification change from the time $t_1$ to $t_2$. A damping curve in FIG. 4B is equivalent to a damping curve drawn when the radiation is stopped at the time $t_1$, and is expressed by $\Delta M_1 \times e^{-(t-t_1)/T}$. On the other hand, FIG. 4C shows the change of magnification from the time $t_1$ to $t_2$ by means of the energy radiation. The characteristic curve in FIG. 4C is equivalent to a characteristic curve of the magnification drawn when the amount of magnification change at the time $t_1$ is zero, and is expressed by $\Delta M \times (1-e^{-(t-t1)/T})$. Namely, it is equivalent to the changing characteristic of the magnification change from the time $t_0$ in FIG. 4A. The characteristic curve from the time $t_1$ to $t_2$ in FIG. 4A is obtained by adding the curves of FIGS. 4B and 4C. That is, from the time $t_1$ to $t_2$, the damped amount of magnification change and the increased amount of magnification change can be composed by the addition, so the relation of the linear sum holds.

Also, the calculation in the main controller 50 is based on this principle. Usually, the main controller 50 has a digital calculator and the change of magnification is calculated constantly by the calculator. As a method of the calculation, it is considered that the period between the time $t_1$ to $t_2$ in FIGS. 4A to 4C is divided into a large number of minute periods of time, the energy entering the projection optical system in each minute period of time is assumed to be uniform, and the relations of FIGS. 4B and 4C are separately calculated to obtain the change of magnification. This is expressed by:

$$\Delta M_{k+1} = \Delta M_k \times \exp(-\Delta t/T) + (\Delta M/E) \times E_k \times \{1-\exp(-\Delta t/T)\}. \quad (7)$$

The suffixes k, k+1 represent the number of times of calculations and $\Delta t$ represents a minute period of time. Also, when the incident energy $E_k$ is kept radiated, the saturation level $\Delta M$ can be expressed by the product of the incident energy $E_k$ and the rate of change $\Delta M/E$. The incident energy $E_k$ is the average energy in the minute period $\Delta t$.

Figure 5A:
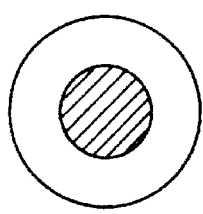
FIGS. 5A to 5C are graphs showing the light quantity distributions in the pupil plane of the projection optical system.
Figure 5B:
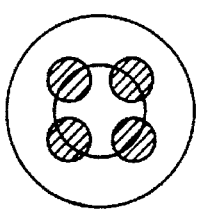
Figure 5C:
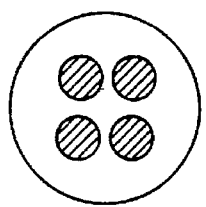

Now, the changing of illumination condition will be discussed with reference to FIGS. 5A to 5C. FIGS. 5A to 5C show the light quantity distributions in the pupil plane of the illumination optical system, i.e., the light intensity distributions of the light emitted from the respective fly eye lens groups and the variable aperture stop 8, and coincide with light quantity distributions in the pupil plane Ep of the projection optical system PL. However, when the reticle R is a phase shift reticle or a mixed reticle, the light quantity distribution of the projection optical system PL will not coincide with that of the illumination optical system. In this case, by inputting the type of reticle pattern, the forming condition thereof, etc in the main controller 50 beforehand from the bar code reader BC or the keyboard 51, it is possible to estimate the light quantity distribution to the pupil plane Ep of the projection optical system PL. For the simplicity of the description, it is to be noted that the light quantity distributions in FIGS. 5A to 5C shall indicate the light quantity distributions in the pupil plane Ep of the projection optical system PL.

When the illumination method is changed from the ordinary illumination method to the deformation light source method in accordance with the replacement of the reticle, i.e., when the fly eye lens group 7A is replaced with the fly eye lens group ($7D_1$ to $7D_4$) by rotating the turret plate 7, the light quantity distribution in the pupil plane Ep of the projection optical system PL is changed from the state in FIG. 5A to the state in FIG. 5C. FIG. 5A shows the light quantity distribution when the ordinary illumination method is adopted (condition (1)) wherein the fly eye lens group 7A and the variable aperture stop 8 are used. FIG. 5C shows the light quantity distribution when the deformation light source method is adopted (condition (2)) wherein the fly eye lens group ($7D_1$ to $7D_4$) is used. FIG. 5B schematically shows the light quantity distribution in a transient state (the state with the hysteresis of the ordinary illumination left) immediately after the changing of illumination condition.

FIGS. 5A to 5C show the light quantity distributions exactly in the pupil Ep or in the vicinity thereof, but, roughly speaking, similar light quantity distributions are exhibited in any portion in the projection optical system PL except portions close to the reticle R. Namely, the fact that the light quantity distribution in the pupil plane Ep is changed means that the light quantity distribution is changed over the whole projection optical system PL. Further, the fact that the light quantity distribution is changed means that even though the sum of energy entering the projection optical system is equal, the characteristic of the temperature rise due to the energy absorption of the projection optical system PL is different, i.e., the temperature distribution of each optical element of the projection optical system PL is different, and according to the above description, the ratio $\Delta M/E$ and the time constant T are different for each illumination condition (the light quantity distribution in the pupil plane Ep). Therefore, when the intensity distribution (light quantity distribution) of the light passing the pupil plane Ep of the projection optical system PL is changed by changing the illumination condition (intensity distribution of the light passing the pupil plane of the illumination optical system) by means of the turret plate 7 and the variable aperture stop 8, replacing the reticle, or switching the reticle pattern by driving the variable blind 10, the imaging characteristics need to be calculated after predetermined calculation parameters, i.e., the ratio $\Delta M/E$ and the time constant T are changed.

As the recurrence formula is used for calculation in the main controller 50, if the amount $\Delta M_k$ is not known, the following amount $\Delta M_{k+1}$ cannot be calculated. However, immediately after the changing of illumination condition, the amount of magnification change becomes unknown owing to the radiation hysteresis of the previous illumination condition. Namely, when exposure is performed under the illumination condition (2) while the projection optical system is radiated under the illumination condition (1), the change of magnification cannot be obtained by the conventional calculation. Differently from the amount of magnification change obtained when the illumination condition is changed under a state that the projection optical system receives no influence from the previous radiation, in the above case, the amount of magnification change is varied by the degree of the influence of the previous radiation, i.e., the degree of the temperature rise of the projection optical system. Therefore, as an actual phenomenon, after the changing of illumination condition, imaging characteristics such as the magnification, etc. become discontinuous. This phenomenon is called the discontinuity of the imaging characteristics (inconvenience (1)) hereinafter.

The calculation in the main controller 50 is executed under the condition that the amount of magnification change is obtained by the linear sum of the damped amount of magnification change and the increased amount of magnification change as mentioned above with reference to FIGS. 4A to 4C. However, in the transient state immediately after the changing of illumination condition, the damped amount changes in accordance with the previous illumination condition while the increased amount changes in accordance with the present illumination condition. Thus, the damped amount and the increased amount are not independent. Therefore, it cannot be said that the damped amount and the increased amount become the linear sum. That is, in the state of FIG. 5B wherein the influences of both illumination conditions are mixed, as the influence of the illumination condition (1) is different from the influence of the illumination condition (2), both influences cannot be simply added similarly to FIGS. 4A to 4C (inconvenience (2)).

In short, in the transient state immediately after the changing of reticle pattern or illumination condition, two inconveniences occur: (1) the discontinuity of the imaging characteristics; (2) the impossibility of the linear sum. The present invention aims at solving the problem (1) chiefly.

Figure 6:
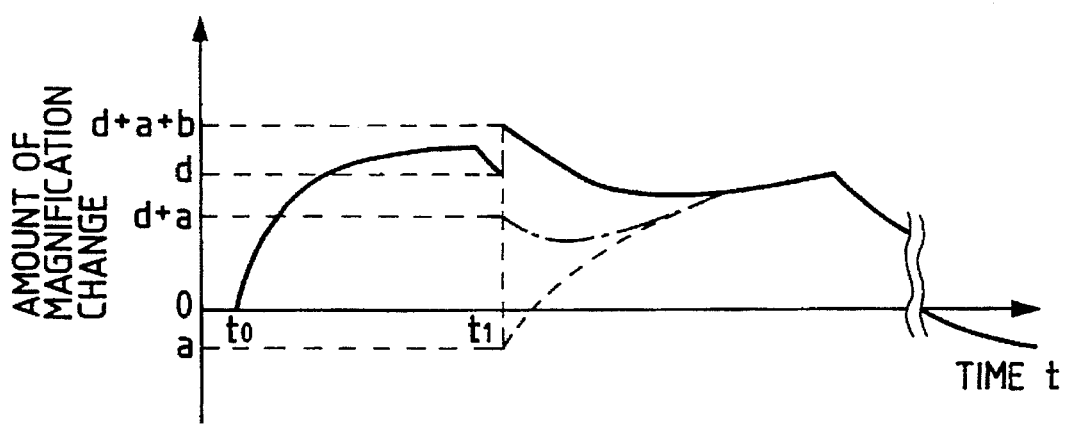
FIG. 6 is a graph for explaining the changing characteristic of the imaging characteristics at the time of the changing of the illumination condition.

The state of the change of magnification when the illumination condition is changed will be described again with reference to FIG. 6. First, when exposure is started from the time $t_0$ under the illumination condition (1) (ordinary illumination method), the magnification is changed as shown in FIG. 6. Actually, the characteristic curve will not be the smooth curve in FIG. 6 due to the step-and-repeat operation, the replacement of the wafer. However, on the average, the amount $\Delta M$ of magnification change is increased in a similar manner to the case that constant energy is continuously radiated. Then, at the time $t_1$, the illumination condition is changed for the illumination condition (2) (deformation light source method) by rotating the turret 7. Here, the amount of magnification change at the time $t_1$ under the previous illumination is assumed to be d. Also, the difference of magnifications under the conditions (1) and (2) when the projection optical system PL is not affected by the radiation (cooled state) is assumed to be a (sign is minus). This difference is caused by the fact that the position of light flux passing the projection optical system PL is different under each illumination condition even in the cooled state, which exerts a subtle influence on various aberrations in the projection optical system PL. When only this is taken into consideration, the amount of magnification change after the changing of illumination condition is (d+a), i.e., $\Delta M_1$. However, there is the amount b of magnification change due to the above-mentioned discontinuity of the imaging characteristics. Therefore, due to this amount b, the amount of magnification change under the condition (2) becomes (d+a+b)=$\Delta M_2$. This corresponds to the above inconvenience (1). Although the dotted line of FIG. 6 indicates the amount of magnification change when there is no influence of the heat stored prior to the change of the illumination condition and exposure is performed from the time $t_1$ under the illumination condition (2) the actual amount of magnification change is changed along the solid line in accordance with the damping of the amount of heat stored under the previous illumination condition. That is, from the time ($t_1$) when the illumination condition is changed to the time when the solid line and the dotted line intersect, the amount of magnification change cannot be calculated theoretically owing to the inconvenience (2). If the heat distribution in the projection optical system PL is calculated precisely, the amount of magnification change can be calculated theoretically, but the amount of calculation becomes too large and it is not realistic. Therefore, according to the conventional method, the amount b is not taken into consideration, so that the amount of magnification change is calculated like the one-dot-chain line and the correction error occurs.

Next, the method of correcting the imaging characteristics according to the embodiment of the present invention will be described. First, the correcting method-regarding the above-mentioned inconvenience (1) will be described. In this embodiment, the amount b of imaging characteristic is obtained in advance, and the amount of imaging characteristic change is calculated by the use of the amount b. Namely, the amount (d+a+b) of magnification change immediately after the changing of illumination condition corresponds to the amount of magnification change obtained when the projection optical system PL is radiated under the illumination condition (1), and immediately thereafter exposure is performed under the illumination condition (2). Therefore, after the projection optical system PL is radiated under the illumination condition (1), the illumination condition is changed and pattern exposure is carried out immediately under the illumination condition (2). At this time, it is not necessary to expose the reticle pattern on the wafer under the illumination condition (1), and simply light should be directed to the projection optical system PL. Also, although under the illumination conditions (1), (2), it is not necessary to utilize reticles for actual exposure, a reticle formed with a plurality of marks for measurement is utilized under the condition (2) in order to obtain the amount of magnification change immediately after the changing of the illumination condition. Next, after development, resist images of a plurality of marks for measurement are detected in each shot area on the wafer by the use of, e.g., an alignment sensor of the projection exposure apparatus. Then, the amount of magnification change immediately after the changing of the illumination condition is obtained based on the coordinate position of each of the resist images on the moving coordinate system (rectangular coordinate system) of the wafer stage WS and its changing characteristic is stored in the main controller 50. This changing characteristic can be expressed by the aforementioned ratio $\Delta M/E$ and the time constant T. The ratio $\Delta M/E$ and the time constant T are also stored in the main controller 50. Thereby, the amount b at the time of the changing of the illumination condition, i.e., the amount (d+a+b) of magnification change is obtained. The amount b is the difference between the amount (1) of magnification change obtained when after the projection optical system PL is radiated under the illumination condition (1) and exposure is performed under that illumination condition (1), and the amount (2) of magnification change obtained when after the projection optical system PL is radiated under the illumination condition (1) and exposure is performed under the illumination condition (2). Accordingly, as soon as the exposure is started under the illumination condition (1), the main controller 50 separately calculates the amount (1) and the amount (2) by the use of predetermined calculation parameters sequentially. At this time, the amount (1) is calculated by the use of the calculation parameters most suitable for the illumination condition (1) as conventional. On the other hand, the amount (2) is calculated by the use of the changing characteristic obtained by the test printing, i.e., the calculation parameters ($\Delta M/E$, T). Then, when the illumination condition is changed, or more precisely immediately before the exposure is restarred, the main controller 50 obtains the difference between the amounts (1) and (2) as the amount b. Also, the amount (1) immediately before the restart of the exposure corresponds to the aforementioned amount d, and as the difference a of the magnifications under the conditions (1) and (2) in the cooled state is stored beforehand, the main controller 50 can obtain the amount (d+a+b) at the time of the changing of the illumination condition. Thereby, the problem of the inconvenience (1) is solved.

The amount b of the imaging characteristic (amount of magnification change) is the difference between the amounts (1) and (2) and will not become a constant value since both amounts have different features. Therefore, it is necessary to obtain the amount b by separately calculating the amounts (1) and (2) as mentioned above. However, when the main controller 50 separately calculates the amounts (1) and (2), the amount of calculation becomes large to and causes the load to be increased. Then, the amount b is assumed to be proportional to the amount (1) and its proportional coefficient (proportionality) may be stored to simplify the above calculation. In this case, the main controller 50 calculates the amount (1) sequentially, and obtains the amount b by multiplying the amount (1) calculated immediately before the restart of the exposure operation by the above proportionality. At this time, the amount b is not the exactly correct value, which but causes little problem for practical use.

Also, when obtaining the calculation parameters (ΔM/E, T) for calculating the amount (2), as disclosed in U.S. Pat. No. 4,900,939, a coater-developer may be connected to the projection exposure apparatus so as to perform the aforementioned test printing, development and measurement automatically by the control of the main controller 50. At this time, the operator only needs to input information regarding the illumination conditions (1) and (2) in the main controller 50 via the keyboard 51.

Further, instead of performing the test printing, as disclosed in U.S. Pat. No. 4,629,313, a light-transmission type reference pattern (slit pattern) may be provided on the wafer stage WS. In this case, a photoelectric detector is disposed thereunder. After the projection optical system PL is illuminated under the illumination condition (1), the illumination condition is changed and immediately thereafter the reticle is illuminated under the illumination condition (2). Then, the projected images of the plurality of reference marks on the reticle are detected via the slit pattern sequentially by the photoelectric detector and the amount of magnification change immediately after the changing of the illumination condition is obtained based on the coordinate positions of the respective projected images on the rectangular coordinate system XY.

Figure 7A:
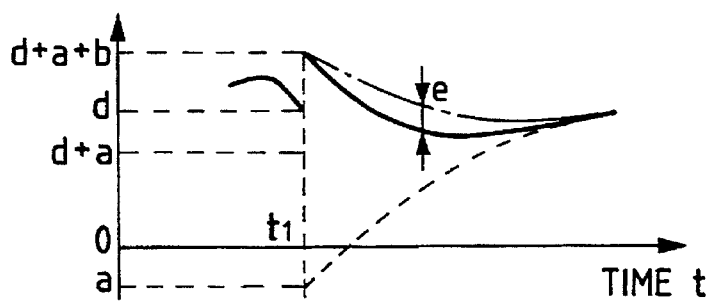
FIGS. 7A to 7C are graphs for explaining the method according to the present invention for calculating the amount of imaging characteristic change at the time of changing the illumination condition.
Figure 7B:
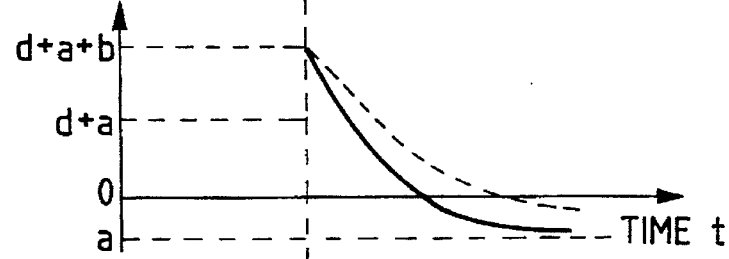
Figure 7C:
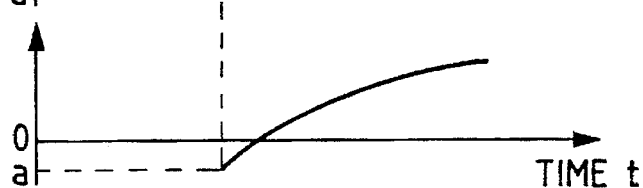

Next, a correcting method regarding the inconvenience (2) will be described with reference to FIGS. 7A to 7C. In this embodiment, the problem of the inconvenience (2) cannot be solved completely, but it is possible to reduce errors in correcting the imaging characteristics due to the inconvenience (2). FIG. 7A shows the amount of magnification change in the vicinity of the time $t_1$ of FIG. 6. In this embodiment, the amount (damped amount) of magnification change due to the hysteresis of the illumination condition (1) set prior to the changing of the illumination condition (before the time $t_1$) and the amount (increased amount) of magnification change produced by the exposure under the illumination condition (2) (after the time $t_1$) are separately calculated and both amounts are simply added to obtain the amount of magnification change calculated immediately after the condition changing operation. Although the amount of magnification change cannot be obtained as the linear sum theoretically, an error (e in FIG. 7A) due to the linear sum is small, so the calculation of the linear sum is adopted in this embodiment. More specifically, regarding the above damped amount as indicated by the solid line in FIG. 7B, it is considered that the amount (d+a+b) of magnification change immediately after the changing of the illumination condition is damped in accordance with the changing characteristic obtained by the above-mentioned test printing or the like. Then, the damped amount is sequentially calculated in accordance with the changing characteristic, i.e., the calculation parameters (ΔM/E, T) for calculating the above amount (2) of magnification change. On the other hand, regarding the increased amount, as shown in FIG. 7C, the amount (a) of magnification change is considered to increase in accordance with the changing characteristic of the magnification under the illumination condition (2) and is calculated in accordance with the calculation parameters most suitable for the illumination condition (2) as conventional. Then, the damped amount and the increased amount are added to obtain the amount of magnification change (corresponding to the one-dot-chain line in FIG. 7A). The obtained amount of magnification change has an error e with respect to the actual amount of magnification change (solid line in FIG. 7A), but this error e is small, so the problem of the inconvenience (2) is solved practically.

The damped amount is calculated in accordance with the calculation parameters for calculating the amount (2) but may be calculated in accordance with the calculation parameters most suitable for the illumination condition (2) in a similar manner to the increased amount by considering that the amount (d+a+b) is damped in accordance with the changing characteristic of the magnification under the illumination condition (2). At this time, the amount (d+a+b) is damped like the dotted line in FIG. 7B, but a large error does not occur with respect to the solid line in FIG. 7B. This is because the damping rates (time constants) for the respective illumination conditions are not so much different from each other in the same projection optical system. The influence of the inconvenience (1) is larger than that of the inconvenience (2). Therefore, if the problem of the inconvenience (1) is solved, the problem of the inconvenience (2) can be solved practically by the rough calculation.

When utilizing the illumination conditions (1) and (2) alternately, between a case of switching the condition (1) with the condition (2) and a case of switching the condition (2) with the condition (1), the sign of the amount b does not become always opposite and the amount b does not always become constant. Therefore, it is necessary to obtain and store not only the changing characteristic when after the projection optical system is radiated under the illumination condition (1), but also the illumination condition is changed and exposure is performed under the illumination condition (2), and the changing characteristic when after the projection optical system is radiated under the illumination condition (2), the illumination condition is changed and exposure is performed under the illumination condition (1). Therefore, as the number of combinations of illumination conditions is increased, the changing characteristic for each combination needs to be obtained and stored in addition to the changing characteristics (calculation parameters) of the respective illumination conditions. As a result, enormous amounts of data is stored. Therefore, the method of the present invention may be utilized only for illumination conditions used frequently, and the conventional method for stopping the exposure operation until the influence of the previous illumination condition disappears may be utilized for the other conditions.

Also, when the imaging characteristics can be measured with real time under the presently used illumination condition (e.g., the spatial image measuring method, as disclosed in U.S. Pat. No. 4,629,313), the imaging characteristics can be corrected without error. However, the measurement cannot be carried out during exposure and further the productivity is lowered due to the measurement. Therefore, this method may be used with the method of the present invention. For example, each time a plurality of wafers have been exposed, imaging characteristics are measured and corrected and while the plurality of wafers are exposed, the amounts of imaging characteristic changes are calculated and corrected.

Further, as disclosed in U.S. Ser. No. 993,460 (Dec. 15, 1992) there is a known focal point detecting system in which light of approximately the same wavelength region as light for exposure is directed to a slit pattern formed on a reference plate on a wafer state from under, the light passing the slit pattern and a projection optical system and being reflected from the pattern surface of a reticle is detected photoelectrically, and a position in which the level of its photoelectric signal becomes maximum when the wafer stage is slightly moved in the direction of the optical axis of the projection optical system is obtained as a best focus position. In such a focal point detecting system, an illumination optical system for emitting the light to the slit pattern is not provided with a mechanism for changing its illumination condition, so that the focal position is detected by illuminating the slit pattern with the continuously constant illumination condition. Therefore, in the above-mentioned transient state immediately after the changing of the illumination condition with respect to the reticle, this focal point detecting system cannot measure the focal position precisely, too. Then, in the transient state, it is preferable to correct the value measured by the focal point detecting system according to the method of the present invention. Also, the method of the present invention is applicable to systems for detecting imaging characteristics other than the focal point detecting system. Namely, in any system for illuminating a reference mark by means of an illumination optical system different from an illumination optical system for exposure and obtaining imaging characteristics by detecting light being emitted and passing the projection optical system, it is preferable to correct its measured value by the use of the method of the present invention.

Next, the exposure operation of the present invention will be briefly described. In FIG. 1, when the title of the reticle R is input from the bar code reader 52 in the main controller 50, the main controller 50 drives the turret plate 7, the variable aperture stops 8, 32 and the variable blind 10 in accordance with the registered operation parameters corresponding to the title to set an optimum exposure condition for the pattern of the reticle R. Here, the ordinary illumination is selected. Then, the fly eye lens group 7A is disposed in the light path and the σ value is set to a predetermined value by the variable aperture stop 8. Thereafter, a first exposure is started by the step-and-repeat operation and calculation parameters (ratio ΔM/E and time constant T) most suitable for the illumination condition (or, the light quantity distribution in the pupil plane Ep of the projection optical system PL corresponding to a combination of the type of reticle pattern and the formed condition thereof) are selected from the memory. Thereafter, the amount of imaging characteristic change of the projection optical system PL is calculated sequentially. The control unit 53 drives the drive elements 25, 27, 29 such that the amount calculated by the main controller 50 becomes zero, whereby the imaging characteristics of the projection optical system PL are maintained to be a predetermined value with high accuracy. The calculation parameters may be stored in the memory so as to correspond to the title of the reticle.

After the first exposure for a predetermined number of wafers W has been terminated, the main controller 50 replaces the reticle in accordance with a predetermined program and drives the turret plate 7, the variable aperture stops 8, 32 and the variable blind 10 in accordance with operation parameters corresponding to the title of the reticle read by the bar code reader 52. Here, the deformation light source method is selected and the fly eye lens Group (7D$_1$ to 7D$_4$) is disposed in the light path. At this time, the replacement of the wafer is carried out in parallel with the replacement of the reticle. During the above operation, light is not emitted to the projection optical system PL and the amount of imaging characteristic change is damped. Therefore, the main controller 50 calculates the amount d of imaging characteristic change sequentially in accordance with calculation parameters corresponding to the damping characteristics at the time of the first exposure until immediately before the start of a second exposure. Also, in parallel to the above operation, the main controller 50 reads, from the memory, the difference a between imaging characteristics of the ordinary illumination method and the deformation light source method under the cooled state, the proportional coefficient for obtaining the amount b of the imaging characteristic produced when the ordinary illumination method is switched with the deformation light source method, calculation parameters (ΔM/E, T) for representing the damping characteristics of the amount of imaging characteristic change due to the amount of heat stored prior to the changing operation of the illumination condition, and calculation parameters most suitable for the illumination condition (or the light quantity distribution in the pupil plane Ep) under the second exposure. Then, immediately before the second exposure, the main controller 50 calculates the amount b by multiplying the amount d of imaging characteristic change by the proportional coefficient to obtain the amount (d+a+b) of imaging characteristic change, and drives the drive elements 25, 27, 29 such that the amount (d+a+b) becomes zero.

Next, the main controller 50 starts the second exposure by opening the shutter 3. Simultaneously, the main controller 50 calculates the damped amount of imaging characteristic change in accordance with the calculation parameters for representing the above-mentioned damping characteristics and the increased amount of imaging characteristic change in accordance with the calculation parameters most suitable for the second exposure, and adds the damped amount and the increased amount. Further, the control unit 53 drives the drive elements 25, 27, 29 such that the amount added by the main controller 50 becomes zero, whereby the imaging characteristics of the projection optical system PL is maintained to be the predetermined value with high accuracy. Therefore, even in the transient state immediately after the changing operation of the illumination condition, the amount of imaging characteristic change can be limited to zero or a predetermined permissible value. Therefore, even though exposure is performed immediately after the condition changing operation, the pattern exposure can be performed under preferable imaging characteristics. Then, when the amount of heat stored prior to the condition changing operation of the illumination condition or the amount of imaging characteristic change due to the amount of stored heat becomes a predetermined permissible value or less, or a predetermined period of time has been passed after the completion of the first exposure, the main controller 50 stops to calculating the damped amount of imaging characteristic change and calculates only the increased amount of imaging characteristic change to correct the imaging characteristic.

In the above description, the damped amount of imaging characteristic change is calculated in accordance with the calculation parameters representing the damping characteristics at the time of the first exposure. However, for example, immediately before starting the second exposure, the calculation parameters to be used in the main controller 50 may be replaced with the calculation parameters for the second exposure and the calculation parameters representing the damping characteristics at the time of the second exposure may be used to calculate the above damped amount.

In this embodiment, although the illumination condition is changed, even though only the reticle pattern is changed without changing the illumination condition, the light quantity distribution in the pupil plane Ep of the projection optical system PL is changeable, the amount of imaging characteristic change may be calculated in the same manner as above. Also, when the amount for indicating discontinuity of the imaging characteristics produced when at least one of the illumination condition and the reticle pattern is changed is zero or a predetermined value or less, it is not necessary to obtain the amount for the discontinuity in advance and the imaging characteristics are obtained and corrected according to the conventional method.

What is claimed is:

1. A projection exposure apparatus comprising:

an illumination optical system for emitting light to a mask;

a projection optical system for projecting an image of a pattern of said mask to a substrate;

a first adjusting device for changing at least one imaging characteristic of said projection optical system;

a second adjusting device for changing an illumination condition with respect to said pattern of said mask by changing an intensity distribution of said light in a Fourier transform plane in said illumination optical system with respect to said pattern of said mask;

a calculator for calculating a correction value of said at least one imaging characteristic of said projection optical system by the use of predetermined calculation parameters while said mask is illuminated under said illumination condition set by said second adjusting device and said image of said pattern is exposed to said substrate;

a controller for controlling said first adjusting device based on said correction value such that said at least one imaging characteristic of said projection optical system is maintained so as to be a predetermined value; and a correcting device for correcting, when changing at least one of said pattern of said mask and said illumination condition and exposing a substrate, at least one imaging characteristic set by said controller based on an amount of energy stored in said projection optical system due to the exposure performed prior to the changing operation.

2. An apparatus according to claim 1, wherein said correcting device calculates an amount of change of said at least one imaging characteristic of said projection optical system corresponding to the amount of energy stored prior to the changing operation, and corrects said at least one imaging characteristic set by said controller by correcting said correction value calculated by said calculator based on said calculated amount of change.

3. An apparatus according to claim 2, wherein said correcting device calculates the amount of change of said at least one imaging characteristic for each increase of predetermined period of time, and stops correcting said at least one imaging characteristic set by said controller when the amount of energy stored prior to the changing operation, or the amount of change of said at least one imaging characteristic becomes a predetermined value or less.

4. A projection exposure apparatus comprising:

an illumination optical system for emitting light to a mask, said illumination optical system having an optical member for changing an illumination condition of said mask;

a projection optical system for projecting an image of a pattern of said mask to a substrate under a predetermined imaging state;

a calculator for calculating a correction value of said imaging state of said image of said pattern by the use of predetermined parameters;

an adjusting device for changing said imaging state of said image of said pattern based on said calculated correction value; and a controller for controlling, when changing at least one of said pattern of said mask and said illumination condition and exposing a substrate, the operation of said adjusting device after said changing operation based on an amount of energy stored in said projection optical system due to an exposure performed prior to said changing operation.

5. A projection exposure apparatus comprising:

an illumination optical system for emitting light to a mask;

a projection optical system for projecting an image of a pattern of said mask on a substrate;

an adjusting device for adjusting an imaging condition of said image of said pattern by the use of predetermined calculation parameters so as to maintain said imaging condition of said image of said pattern approximately constant; and a correcting device for correcting, when changing said pattern of said mask and exposing a substrate, an amount of adjustment of said imaging state performed by said adjusting device after said changing operation based on an amount of energy stored in said projection optical system due to an exposure performed prior to the changing operation.

6. A projection exposure apparatus comprising:

an illumination optical system for emitting light to a mask, said illumination optical system having an optical member for changing an illumination condition of said mask;

a projection optical system for projecting an image of a pattern of said mask on a substrate;

an adjusting device for adjusting an imaging state of said image of said pattern by the use of predetermined calculation parameters so as to maintain said imaging condition of said image of said pattern approximately constant; and a controller for controlling, when changing said illumination condition and exposing a substrate, the operation of said adjusting device after said changing operation in accordance with an amount of energy stored in said projection optical system due to an exposure performed prior to said changing operation.

7. A projection exposure apparatus comprising:

a light source;

an illumination optical system disposed between said light source and a mask for illuminating said mask with light from said light source;

a projection optical system disposed between said mask and a substrate for projecting an image of a pattern of said mask on said substrate;

a first adjusting device associated with said projection optical system for changing at least one imaging characteristic of said projection optical system;

a second adjusting device associated with said illumination optical system for changing an illumination condition with respect to said mask, an intensity distribution of said light in a pupil plane of said illumination optical system being changed in accordance with the change of said illumination condition;

a first controller associated with said first adjusting device for controlling said first adjusting device such that the at least one imaging characteristic of said projection optical system is maintained within a predetermined permissible range; and a second controller associated with said first controller for altering the operation of said first controller, after the change of said illumination condition, based on an amount of energy stored in said projection optical system prior to the change of said illumination condition.

8. A projection exposure apparatus comprising:

a projection optical system disposed between a mask and a substrate for projecting an image of a pattern of said mask on said substrate;

a first adjusting device associated with said projection optical system for changing at least one imaging characteristic of said projection optical system;

a first controller associated with said first adjusting device for controlling said first adjusting device such that the at least one imaging characteristic of said projection optical system is maintained within a predetermined permissible range; and a second controller associated with said first controller for altering, after changing said pattern of said mask, the operation of said first controller, based on an amount of energy stored in said projection optical system prior to the change of said pattern of said mask.

9. A projection exposure apparatus comprising: a light source;

an illumination optical system disposed between said light source and a mask for illuminating said mask with light from said light source;

a projection optical system disposed between said mask and a substrate for projecting an image of a pattern of said mask;

a mask stage disposed between said illumination optical system and said projection optical system for holding said mask so as to be shiftable along an optical axis of said projection optical system and inclinable with respect to a plane perpendicular to said optical axis;

an adjusting device associated with said mask stage for adjusting at least one of a position of said mask along the optical axis and the inclination of said mask with respect to said plane perpendicular to said optical axis such that an imaging condition of said image of said pattern is maintained in a predetermined permissible range; and a controller associated with said adjusting device for altering, after changing a distribution of a quantity of light in a pupil plane of said projection optical system, the operation of said adjusting device based on an amount of energy stored in said projection optical system prior to the change of the distribution of the quantity of light.

10. A method of projecting and exposing a pattern image of a mask on a substrate via a projection optical system comprising the steps of:

changing an illumination condition with respect to said mask, a distribution of a quantity of light in a pupil plane of said projection optical system being changed in accordance with the change of said illumination condition; and controlling an imaging condition of said pattern image after the change of said illumination condition, in consideration of an amount of energy stored in said projection optical system prior to the change of said illumination condition.

11. A projection exposure method according to claim 10, comprising the substep of:

determining the amount of change of said imaging condition of said pattern image produced at the time of changing said illumination condition with respect to said mask, based on the amount of energy stored in said projection optical system prior to the change of said illumination condition.

12. A projection exposure method according to claim 11, further comprising the substep of:

obtaining a relationship between the amount of change of said imaging condition of said pattern image produced before and after changing said illumination condition with respect to said mask and the amount of energy stored in said projection optical system.

13. A projection exposure method according to claim 10, wherein the change of said imaging condition of said pattern image is performed by shifting some of a plurality of lens elements of said projection optical system.

14. A projection exposure method according to claim 13, wherein owing to the shift of said some lens elements of said projection optical system, at least one of magnification, distortion, curvature of field, spherical aberration and astigmatism of said projection optical system is corrected.

15. A projection exposure method according to claim 10, wherein the control of said imaging condition of said pattern image is performed by regulating a pressure of a closed space provided in said projection optical system.

16. A projection exposure method according to claim 10, wherein the control of said imaging condition of said pattern image is performed by adjusting one of a position of said mask along an optical axis of said projection optical system and an inclination of said mask with respect to a plane perpendicular to the optical axis of said projection optical system.

17. A projection exposure method according to claim 16, wherein at least one of pin-cushion distortion and barrel-shape distortion of said pattern image is corrected by the adjustment of said mask.

18. A projection exposure method comprising the steps of:

changing a pattern of a mask to be projected on a substrate via a projection optical system, a distribution of a quantity of light on a pupil plane of said projection optical system being changed due to the change of said mask pattern; and controlling an imaging condition of an image of said mask pattern after the change of said mask pattern, in consideration of an amount of energy stored in said projection optical system prior to the change of said mask pattern.

19. A projection exposure method according to claim 18, further comprising the substep of determining an amount of change of said imaging condition of said pattern image produced due to the change of said mask pattern, based on the amount of energy stored in said projection optical system prior to the change of said mask pattern.

20. A projection exposure method according to claim 19, further comprising the substep of obtaining a relationship between the amount of change of said imaging condition of said pattern image produced before and after the change of said mask pattern and the amount of energy stored in said projection optical system.

21. A projection exposure method according to claim 18, wherein the control of said imaging condition of said pattern image is performed by shifting some of a plurality of lens elements of said projection optical system.

22. A projection exposure method according to claim 21, wherein at least one of magnification, distortion, curvature of field, spherical aberration and astigmatism of said projection optical system is corrected by the shifting of said some lens elements of said projection optical system.

23. A projection exposure method according to claim 18, wherein the control of said imaging condition of said pattern image is performed by regulating a pressure of a closed space provided in said projection optical system.

24. A projection exposure method according to claim 18, wherein the control of said imaging condition of said pattern image is performed by adjusting at least one of a position of said mask along an optical axis of said projection optical system and an inclination of said mask with respect to a plane perpendicular to the optical axis of said projection optical system.

25. A projection exposure method according to claim 24, wherein owing to the control of said imaging condition, at least one of pin-cushion distortion and barrel-shape distortion of said pattern image is corrected.

26. A projection exposure method for exposing an image of a pattern of a mask on a substrate through a projection optical system comprising the steps of:

changing a distribution of a quantity of light in a pupil plane of said projection optical system;

determining an amount of correction of at least one imaging characteristic of said pattern image in accordance with the changed distribution of the quantity of light;

altering the amount of correction of said at least one imaging characteristic based on an amount of energy stored in said projection optical system prior to the change of the distribution of the quantity of light; and controlling said at least one imaging characteristic of said pattern image by the use of the altered amount of correction.

* * * * *